(12) United States Patent
Izumi

(10) Patent No.: US 9,272,635 B2
(45) Date of Patent: Mar. 1, 2016

(54) POWER STORAGE SYSTEM AND METHOD OF CALCULATING FULL CHARGE CAPACITY

(71) Applicant: Junta Izumi, Nagoya (JP)

(72) Inventor: Junta Izumi, Nagoya (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 181 days.

(21) Appl. No.: 14/079,188

(22) Filed: Nov. 13, 2013

(65) Prior Publication Data

US 2014/0139189 A1    May 22, 2014

(30) Foreign Application Priority Data

Nov. 16, 2012   (JP) ................. 2012-252095

(51) Int. Cl.
| | | |
|---|---|---|
| *H02J 7/00* | (2006.01) | |
| *B60L 11/18* | (2006.01) | |
| *H01M 10/48* | (2006.01) | |
| *G01R 31/36* | (2006.01) | |

(52) U.S. Cl.
CPC ............ *B60L 11/1861* (2013.01); *G01R 31/361* (2013.01); *G01R 31/3624* (2013.01); *H01M 10/48* (2013.01); *H02J 7/0047* (2013.01); *B60L 2240/547* (2013.01); *B60L 2240/549* (2013.01); *H01M 2220/20* (2013.01); *H02J 2007/005* (2013.01); *Y02T 10/7005* (2013.01); *Y02T 10/705* (2013.01); *Y02T 10/7044* (2013.01)

(58) Field of Classification Search
CPC .......... B60L 11/1861; B60L 2240/547; G01R 31/361; G01R 31/3624; H01M 10/48; H01M 2220/20; H02J 7/005; Y02T 10/7005; Y02T 10/7044

USPC .......................................................... 320/134
See application file for complete search history.

(56) References Cited

U.S. PATENT DOCUMENTS

2012/0112754 A1*   5/2012   Kawai .................... 324/428

FOREIGN PATENT DOCUMENTS

| JP | 07-099065 A | 4/1995 |
|---|---|---|
| JP | 11-038105 A | 2/1999 |
| JP | 2000323183 A | 11/2000 |
| JP | 2006-284431 A | 10/2006 |
| JP | 2006-292492 A | 10/2006 |
| JP | 2009145065 A | 7/2009 |
| JP | 2010-217079 A | 9/2010 |
| JP | 2010272579 A | 12/2010 |
| JP | 2011-106953 A | 6/2011 |
| JP | 2012-063244 A | 3/2012 |

* cited by examiner

*Primary Examiner* — Vuthe Siek
(74) *Attorney, Agent, or Firm* — Sughrue Mion, PLLC

(57) ABSTRACT

A power storage system includes a power storage device configured to be charged and discharged, and a controller configured to calculate an open-circuit voltage of the power storage device from relationships between a plurality of current values and voltage values detected in a predetermined period during charge and discharge of the power storage device, specify an SOC corresponding to the calculated open-circuit voltage, from a correspondence relationship between the SOC and the open-circuit voltage of the power storage device, and calculate a full charge capacity of the power storage device, based on the SOC specified with respect to each of a first period and a second period during charge and discharge, and an integrated value of charge and discharge current of the power storage device from the first period to the second period. A method of calculating the full charge capacity in this manner is also provided.

7 Claims, 6 Drawing Sheets

US 9,272,635 B2

POWER STORAGE SYSTEM AND METHOD OF CALCULATING FULL CHARGE CAPACITY

INCORPORATION BY REFERENCE

The disclosure of Japanese Patent Application No. 2012-252095 filed on Nov. 16, 2012 including the specification, drawings and abstract is incorporated herein by reference in its entirety.

BACKGROUND OF THE INVENTION

1. Field of the Invention

The invention relates to a technology of estimating the state of charge of a secondary battery, or the like, and particularly relates to a technology of estimating the full charge capacity from the state of charge.

2. Description of Related Art

It is known that a secondary battery deteriorates due to chronological changes, resulting in reduction of its full charge capacity. If the full charge capacity of the secondary battery is reduced, the amount of electric power that can be used is reduced, and the travel distance of the vehicle (in an EV traveling mode, for example) using electric power is reduced. Therefore, if the full charge capacity of the secondary battery that is in use cannot be grasped with high accuracy, the travel distance of the vehicle using electric power may become shorter than the travel distance corresponding to reduction of the full charge capacity due to chronological changes.

The SOC (State of Charge) of the secondary battery represents the proportion of the current charging capacity to the full charge capacity. Although charge and discharge of the secondary battery can be controlled based on the SOC, the SOC changes if the full charge capacity changes. Thus, if the full charge capacity of the secondary battery cannot grasped with high accuracy, excessive charge and discharge control may be performed on the amount of electric power that can be used.

As a method of estimating the full charge capacity of the secondary battery, the full charge capacity can be calculated, using an integrated value of electric current during external charging, and the SOC estimated at the start of charging and the SOC estimated at the end of charging, for example.

The SOC can be specified from the open-circuit voltage (OCV) of the secondary battery. Since the SOC and the OCV are in correspondence relationship, the SOC can be specified from the OCV if the correspondence relationship is obtained in advance. However, the SOC at each point in time of the start of charging and the end of charging, which is used for estimating the full charge capacity, is grasped from instantaneous conditions of the secondary battery at the specified point in time. Thus, the SOC may not be calculated with high accuracy.

Namely, the OCV is not grasped from conditions of the secondary battery while both of a charging operation and a discharging operation are continuously performed over a given period of time, in other words, from variations in current values and voltage values within a given period, but is simply grasped from conditions of the secondary battery at the start and the end of a charging/discharging operation, or from instantaneous conditions of the secondary battery at certain points in time during a charging/discharging operation. Thus, since the SOC is calculated based on the OCV that is influenced by the usage history of the secondary battery up to each point in time, the full charge capacity may not be calculated with high accuracy. Documents that refer to technologies concerning the charging rate and full charge capacity of the secondary battery include, for example, Japanese Patent Application Publications No. 07-99065 (JP 07-99065 A), No. 2010-217079 (JP 2010-217079 A), No. 2006-284431 (JP 2006-284431 A), No. 2012-063244 (JP 2012-063244 A), No. 2006-292492 (JP 2006-292492 A), No. 2011-106953 (JP 2011-106953 A), and No. 11-38105 (JP 11-38105 A).

SUMMARY OF THE INVENTION

The invention provides a power storage system that can estimate the full charge capacity of a power storage device with high accuracy, by grasping the state of charge on which an influence of the usage history of the power storage device is reduced or curbed. The invention also provides a method of calculating the full charge capacity.

According to one aspect of the invention, a power storage system installed on a vehicle is provided which includes a power storage device configured to be charged and discharged, and a controller that calculates a full charge capacity of the power storage device. The controller is configured to calculate an open-circuit voltage of the power storage device from relationships between a plurality of current values and a plurality of voltage values detected in a predetermined period during charge and discharge of the power storage device, specify an SOC corresponding to the calculated open-circuit voltage, from a correspondence relationship between the SOC and the open-circuit voltage of the power storage device, and calculate the full-charge capacity of the power storage device, based on the SOC specified with respect to each of a first period and a second period during charge and discharge, and an integrated value of charge and discharge current of the power storage device from the first period to the second period.

According to the power storage system as described above, the full charge capacity is calculated by specifying the SOC of the power storage device, based on the open-circuit voltage calculated from the relationships between a plurality of current values and a plurality of voltage values detected in the predetermined period during charge and discharge of the power storage device. Therefore, an influence of the usage history of the power storage device on the SOC is curbed or reduced, and the full charge capacity of the power storage device can be calculated with high accuracy.

The controller may calculate the full charge capacity, when dispersion, a maximum current value, and a minimum current value of the above-indicated plurality of current values detected in the first period or the second period satisfy respective conditions using respective reference values determined according to a given estimation accuracy of the SOC.

Also, the controller may be configured to calculate the integrated value, based on the charge and discharge current of the power storage device from an end of the first period to an end of the second period.

Also, the controller may be configured to calculate the full charge capacity when an elapsed time between the first period and the second period is within a predetermined period of time.

Also, the controller may be configured to calculate a full-charge-capacity learned value by learning each time the full charge capacity is calculated. In this case, the controller may be configured to calculate a new full-charge-capacity learned value by reflecting the calculated full charge capacity by the full-charge-capacity learned value calculated last time, and change an amount of reflection of the calculated full-charge capacity reflected by the new full-charge-capacity learned value, based on dispersion of the above-indicated plurality of current values detected in the first period and the second period, and a range of variation of the current values based on a maximum current value and a minimum current value.

Also, the controller may be configured to calculate the open-circuit voltage by detecting relationships between a plurality of current values and a plurality of voltage values in the predetermined period for calculating the full charge capacity, during a charging or discharging operation of the power storage device while the vehicle is traveling.

According to another aspect of the invention, a method of calculating a full charge capacity of a power storage device installed on a vehicle is provided. The method of calculating the full charge capacity includes a step of detecting relationships between a plurality of current values and a plurality of voltage values, in each of a first period and a second period during charge and discharge of the power storage device, a step of calculating an open-circuit voltage of the power storage device in each of the first period and the second period, from the relationships between the current values and the voltage values, a step of specifying an SOC corresponding to the calculated open-circuit voltage, from a correspondence relationship between the SOC and the open-circuit voltage of the power storage device, and a step of calculating the full charge capacity, based on the SOC specified with respect to each of the first period and the second period, and an integrated value of charge and discharge current of the power storage device from the first period to the second period.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
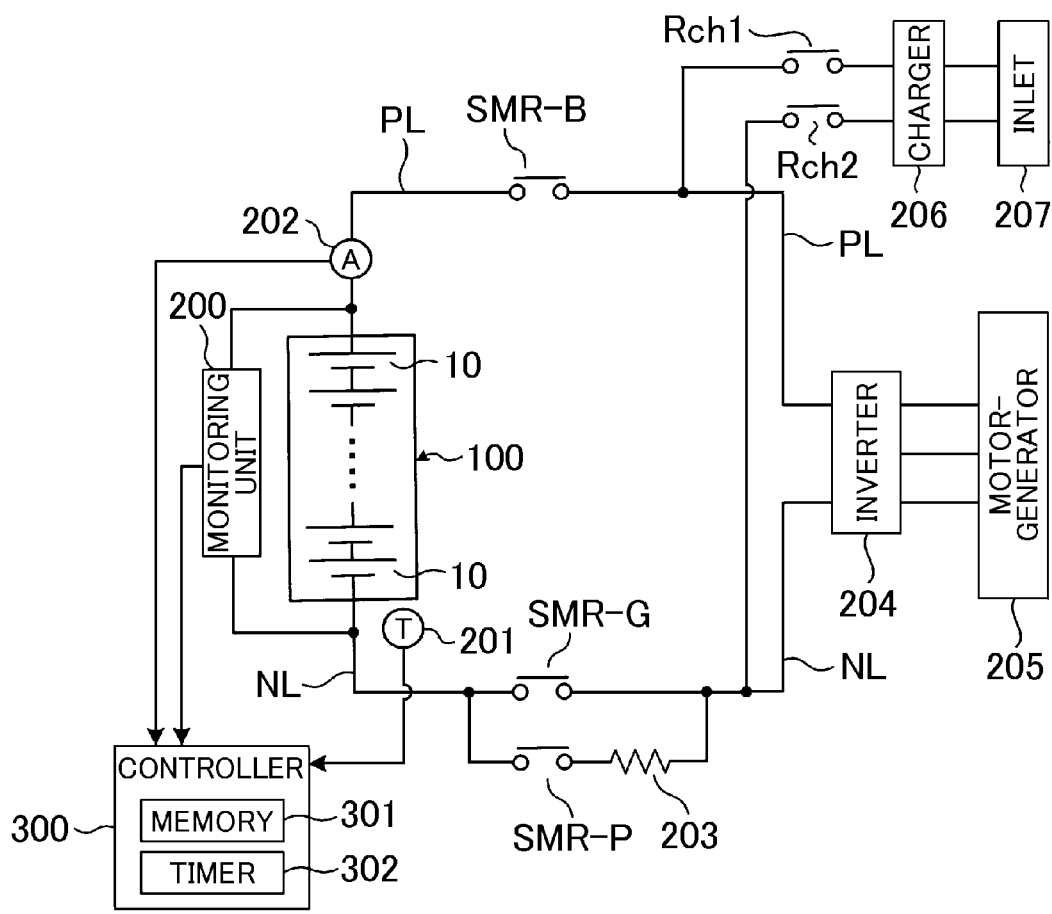
FIG. 1 is a view showing the configuration of a power storage system according to one embodiment of the invention.

One embodiment of the invention will be described. FIG. 1 shows the configuration of a power storage system as this embodiment of the invention. The power storage system shown in FIG. 1 may be installed on a vehicle, for example. The vehicle may be HV (hybrid vehicle), PHV (Plug-in Hybrid vehicle), or EV (Electric Vehicle), for example.

When the vehicle is HV or PHV, it includes a battery assembly as will be described later, and another power source, such as an engine or a fuel cell, as power sources for traveling the vehicle. When the vehicle is PHV, the battery assembly can be charged with electric power supplied from an external power supply. In the HV or PHV having an engine, kinetic energy generated by the engine is converted into electric energy, so that the battery assembly can be charged using the electric energy.

The EV (electric vehicle) includes only the battery assembly as a power source for traveling the vehicle, and the battery assembly can be charged with electric power supplied from an external power supply. The external power supply is a power supply (e.g., a commercial power supply) installed separately from the vehicle, at a location outside the vehicle.

The battery assembly (corresponding to the power storage device) 100 has a plurality of cells (corresponding to power storage elements) 10 connected in series. A secondary battery, such as a nickel-metal-hydride battery or a lithium-ion battery, may be used as each of the cells 10. Also, an electric double layer capacitor may be used instead of the secondary battery.

The number of cells 10 that constitute the battery assembly 100 may be set as appropriate, based on power required to be generated from the battery assembly 100, for example. While all of the cells 10 are connected in series in the battery assembly 100 of this embodiment, the battery assembly 100 may include a plurality of cells that are connected in parallel. A monitoring unit 200 detects the voltage between the terminals of the battery assembly 100, or detects the voltage between the terminals of each cell 10, and outputs the detection result to an ECU (Electronic Control Unit) 300. The specific configuration of the monitoring unit 200 will be described later.

A temperature sensor 201 detects the temperature of the battery assembly 100 (or cell(s) 10), and outputs the detection result to the ECU 300. The temperature sensor 201 may be provided at one location of the battery assembly 100, or two or more temperature sensors 201 may be provided at different locations in the battery assembly 100. If temperatures detected by the two or more temperature sensors 201 are different from each other, a central value of the detected temperatures may be used as the temperature of the battery assembly 100.

A current sensor 202 detects electric current flowing through the battery assembly 100, and outputs the detection result to the ECU 300. In this embodiment, current values detected by the current sensor 202 during discharging of the battery assembly 100 are positive values. Also, current values detected by the current sensor 202 during charging of the battery assembly 100 are negative values.

In this embodiment, the current sensor 202 is provided in a positive line PL connected to a positive terminal of the battery assembly 100. However, the location of the current sensor 202 is not limited to that of this embodiment, but may be selected as desired provided that the current sensor 202 is able to detect current flowing through the battery assembly 100. For example, the current sensor 202 may be provided in a negative line NL connected to a negative terminal of the battery assembly 100. Two or more current sensors 202 may also be used.

The ECU (corresponding to the controller) 300 has a memory 301, and the memory 301 stores various information used when the ECU 300 performs certain operations (for example, operations which will be described in this embodiment). The ECU 300 also has a timer 302, and the timer 302 is used for measuring time. While the memory 301 and the timer 302 are incorporated in the ECU 300 in this embodiment, at least one of the memory 301 and the timer 302 may be provided outside the ECU 300.

A system main relay SMR-B is provided in the positive line PL. The system main relay SMR-B switches between ON and OFF, in response to a control signal from the ECU 300. A system main relay SMR-G is provided in the negative line NL. The system main relay SMR-G switches between ON and OFF, in response to a control signal from the ECU 300.

A system main relay SMR-P and a current-limiting resistor 203 are connected in parallel with the system main relay SMR-G. The system main relay SMR-P and the current-limiting resistor 203 are connected in series. The system main relay SMR-P switches between ON and OFF, in response to a control signal from the ECU 300. The current-limiting resistor 203 is used for curbing flow of inrush current, when the battery assembly 100 is connected to a load (more specifically, an inverter 204 that will be described later).

When the battery assembly 100 is connected to the inverter 204, the ECU 300 initially switches the system main relay SMR-B from OFF to ON, and switches the system main relay SMR-P from OFF to ON. As a result, current is passed through the current-limiting resistor 203.

Then, the ECU 300 switches the system main relay SMR-G from OFF to ON; thereafter, the ECU 300 switches the system main relay SMR-P from ON to OFF. In this manner, connection between the battery assembly 100 and the inverter 204 is completed, and the power storage system shown in FIG. 1 is brought into a startup status (Ready-On). The ECU 300 receives information concerning ON/OFF (IG-ON/IG-OFF) of an ignition switch of the vehicle, and the ECU 300 starts the power storage system, in response to switching of the ignition switch from OFF to ON.

When the ignition switch turns from ON to OFF, on the other hand, the ECU 300 switches the system main relays SMR-B, SMR-G from ON to OFF. As a result, the battery assembly 100 is disconnected from the inverter 204, and the power storage system is brought into a shutdown status.

The inverter 204 converts DC power generated from the battery assembly 100, to AC power, and delivers the AC power to a motor-generator 205. For example, a three-phase AC motor may be used as the motor-generator 205. The motor-generator 205 receives the AC power from the inverter 204, and generates kinetic energy for traveling the vehicle. The kinetic energy generated by the motor-generator 205 is transmitted to the wheels, so as to run the vehicle.

When the vehicle is decelerated, or stopped, the motor-generator 205 converts kinetic energy generated during braking of the vehicle, to electric energy (AC power). The inverter 204 converts the AC power generated by the motor-generator 205, to DC power, and delivers the DC power to the battery assembly 100. In this manner, the regenerative power can be stored in the battery assembly 100.

While the battery assembly 100 is connected to the inverter 204 in this embodiment, the invention is not limited to this arrangement. More specifically, the battery assembly 100 may be connected to a boost circuit, and the boost circuit may be connected to the inverter 204. The boost circuit may be used for boosting the output voltage of the battery assembly 100. Also, the boost circuit may step down the output voltage of the inverter 204, and delivers the resulting power to the battery assembly 100.

A battery charger 206 is connected to the positive line PL and the negative line NL. More specifically, the charger 206 is connected to the positive line PL that connects the system main relay SMR-B with the inverter 204, and to the negative line NL that connects the system main relay SMR-G with the inverter 204. An inlet (connector) 207 is connected to the charger 206.

Charging relays Rch1, Rch2 are provided in lines that connect the charger 206 with the lines PL, NL. Each of the charging relays Rch1, Rch2 switches between ON and OFF, in response to a control signal from the ECU 300.

A plug (connector) connected with an external power supply (not shown) is connected to the inlet 207. With the plug thus connected to the inlet 207, electric power can be supplied from the external power supply to the battery assembly 100 via the charger 206. In this manner, the battery assembly 100 can be charged, using the external power supply. When the external power supply supplies AC power, the charger 206 converts the AC power received from the external power supply, to DC power, and delivers the DC power to the battery assembly 100. The ECU 300 can control the operation of the charger 206.

The charger 206 is also able to convert the voltage when it supplies electric power from the external power supply to the battery assembly 100. Charging of the battery assembly 100 with electric power supplied from the external power supply will be called "external charging". In the power storage system of this embodiment, when the charging relays Rch1, Rch2 and the system main relays SMR-B, SMR-G are ON, electric power is supplied from the external power supply to the battery assembly 100. When external charging is performed, constant current can be supplied to the battery assembly 100, and the battery assembly 100 can be charged with constant current.

The system that supplies electric power from the external power supply to the battery assembly 100 is not limited to the system as shown in FIG. 1. For example, the charger 206 may be connected to the battery assembly 100 without the system main relays SMR-B, SMR-P, SMR-G interposed therebetween. More specifically, the charger 206 may be connected to the positive line PL that connects the battery assembly 100 and the system main relay SMR-B, and the negative line NL that connects the battery assembly 100 and the system main relay SMR-G, via the charging relays Rch1, Rch2. In this case, external charging can be performed by switching the charging relays Rch1, Rch2 from OFF to ON.

While external charging is performed by connecting the plug to the inlet 207 in this embodiment, the invention is not limited to this arrangement. More specifically, a charging system that employs a so-called contactless charging method may be used so as to supply electric power from an external power supply to the battery assembly 100. The charging system that employs the contactless charging method utilizes electromagnetic induction or resonance phenomenon, so that electric power can be wirelessly supplied to the battery assembly 100. The charging system employing the contactless charging method may have a known configuration or arrangement as appropriate.

While the charger 206 is installed on the vehicle in this embodiment, the invention is not limited to this arrangement. Namely, the charger 206 may be installed separately from the vehicle, at a location outside the vehicle. In this case, the ECU 300 can control the operation of the charger 206, via communications between the ECU 300 and the charger 206.

Figure 2:
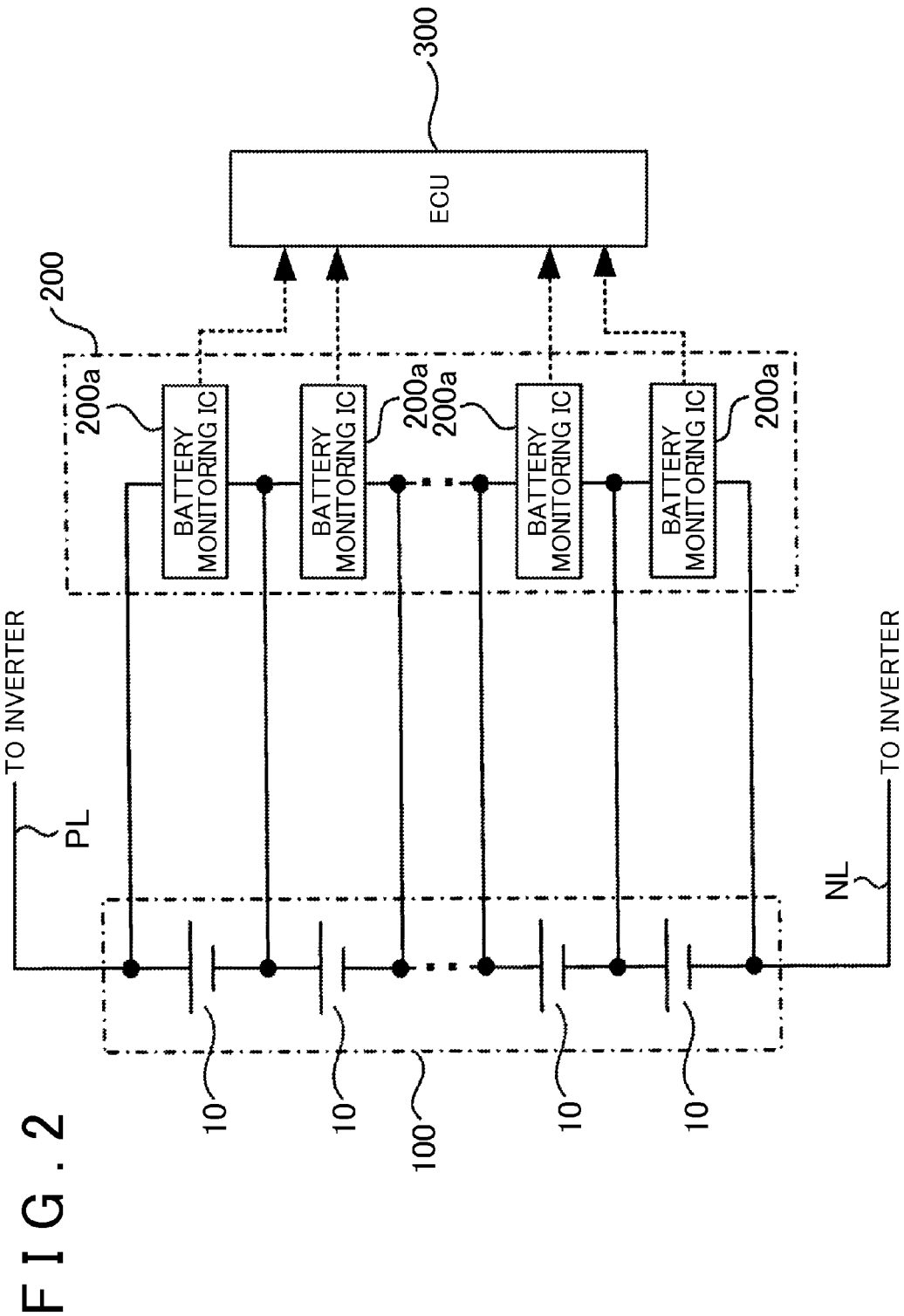
FIG. 2 is a view mainly showing the configuration of a monitoring unit shown in FIG. 1.

Next, the configuration of the monitoring unit 200 will be described. As shown in FIG. 2, the monitoring unit 200 has voltage monitoring ICs (Integrated Circuits) 200a, the number of which is equal to the number of the cells 10 that constitute the battery assembly 100. Each of the voltage monitoring ICs 200a is connected in parallel with a corresponding one of the cells 10. The voltage monitoring IC 200a detects the voltage of the corresponding cell 10, and outputs the detection result to the ECU 300.

While the voltage monitoring IC 200a is provided for each of the cells 10 in this embodiment, the invention is not limited to this arrangement. For example, when the plurality of cells that constitute the battery assembly 100 are divided into two or more battery blocks, the voltage monitoring IC 200a may be provided for each of the battery blocks. Namely, the voltage monitoring IC 200a may be connected in parallel with the corresponding battery block.

Each of the above-mentioned battery blocks consists of two or more cells 10 connected in series, and the two or more battery blocks are connected in series, to constitute the battery assembly 100. In this case, the voltage monitoring IC 200a detects the voltage of the corresponding battery block, and outputs the detection result to the ECU 300. Each of the battery blocks may include two or more cells 10 that are connected in parallel.

The ECU 300 calculates (estimates) the SOC of the battery assembly 100, based on voltage values detected by the monitoring unit 200, battery temperature detected by the temperature sensor 201, and current values detected by the current sensor 202, and performs charge and discharge control on the battery assembly 100, based on the calculated SOC and an estimated value of the full charge capacity. The ECU 300 may be configured to include respective functions as an SOC estimating unit, a full charge capacity calculating unit, and an external charging control unit.

The SOC of the battery assembly 100 indicates the state of charge, i.e., the ratio of the current charging capacity to the full charge capacity of the battery assembly 100, and the full charge capacity is the upper limit of the SOC. The SOC can be specified from the open-circuit voltage (OCV) of the battery assembly 100. For example, an SOC-OCV map as data of correspondence relationship between the SOC and OCV of the battery assembly 100 is stored in advance in the memory 301. The ECU 300 can calculate the OCV of the battery assembly 100 from the voltage (CCV: Closed Circuit Voltage) detected by the monitoring unit 200, and calculate the SOC from the SOC-OCV map.

The correspondence relationship between the SOC and OCV of the battery assembly 100 varies with the battery temperature; therefore, SOC-OCV maps for respective battery temperatures may be stored in the memory 301, and one of the SOC-OCV maps may be selected according to the battery temperature detected when the SOC is estimated from the OCV of the battery assembly 100, so that the SOC of the battery assembly 100 is estimated.

Accordingly, the ECU 300 can grasp an excessively charged condition or excessively discharged condition of the battery assembly 100, by monitoring the voltage value (CCV) detected by the monitoring unit 200 during charge or discharge. For example, the ECU 300 can perform charge and discharge control to restrict charging of the battery assembly 100 so that the calculated SOC does not exceed a predetermined upper-limit SOC relative to the full charge capacity, and restrict discharge so that the calculated SOC does not become lower than a lower-limit SOC.

The ECU 300 may be provided for each inverter 204 and motor-generator 205, or a separate controller for performing the SOC estimating operation, full charge capacity estimating operation and the external charging operation may be provided independently of vehicle control. Namely, a central control unit that controls the whole vehicle may control each of the above-indicated units, or individual controllers may be provided for controlling the respective units, and a central control unit may be connected to each of the individual controllers.

The full charge capacity (FCC) of the battery assembly 100 may be calculated according to Eq. 1 as follows.

$$\text{Full Charge Capacity (FCC)} = 100 \div (\text{SOC\_}e - \text{SOC\_}s) \times \text{Integrated Current Value} \quad \text{(Eq. 1)}$$

In Eq. 1 above, FCC is the full charge capacity of the battery assembly 100 based on actually measured values. The SOC_s is the SOC of the battery assembly 100 obtained when the integration of the current is started, and the SOC_e is the SOC of the battery assembly 100 obtained when the current integration is finished. The integrated current value is obtained by integrating the charge and discharge current of the battery assembly 100 during a period from the time when SOC_s is calculated to the time when SOC_e is calculated, where the discharging current is positive and the charging current is negative.

A full-charge-capacity learned value is a learned value of the full charge capacity calculated using the FCC based on the actually measured values. For example, the full-charge-capacity learned value may be calculated from the FCC and the full-charge-capacity learned value calculated the last time, as indicated in Eq. 2 below.

$$\text{Full-Charge-Capacity Learned Value} = \text{Last Full-Charge-Capacity Learned Value} \times (1-K) + \text{FCC} \times K \quad \text{(Eq. 2)}$$

In Eq. 2 above, K is a reflection coefficient (learning parameter) that determines the ratio between the FCC based on the actually measured values and the last full-charge-capacity learned value, which are included in the full-charge-capacity learned value calculated this time. K is a value in the range of 0 to 1, and is determined based on a correlation coefficient R as will be described later.

As can be understood from Eq. 2 above, the full-charge-capacity learned value of this embodiment is obtained by calculating the FCC as an actually measured, full-charge-capacity acquired value, based on a difference in the SOC of the battery assembly 100 and the current integrated value, and learning the FCC and calculating the full-charge-capacity learned value each time the FCC is calculated. Then, the full-charge-capacity learned value (new full-charge-capacity learned value) is calculated by reflecting the full-charge-capacity learned value obtained the last time and the latest FCC obtained this time at a certain ratio. By using the full-charge-capacity learned value, the ECU 300 can determine the distance the vehicle can travel using electric power of the battery assembly 100, and the upper limit and lower limit of the SOC for use in charge and discharge control based on the SOC of the battery assembly 100. Also, the ECU 300 can grasp a deteriorating condition of the battery assembly 100 (cells 10) from changes in the full-charge-capacity learned value.

According to the related art, the FCC of the battery assembly 100 is calculated, using the SOC_s obtained when external charging is started, SOC_e obtained when the external charging is finished, and the integrated value of charging current during the external charging.

However, each of the SOCs obtained at the time when an external charging operation is started and the time when it is finished, for use in calculation of the FCC, is calculated based on the OCV grasped from a condition of the battery assembly 100 at the moment or point in time at which the external charging operation is started or finished. Therefore, the SOC has an influence of the usage history of the battery assembly 100 up to each of the time points at which the external charging is started and finished, and the SOC cannot be calculated with high accuracy.

More specifically, it is known that polarization occurs when charge or discharge of the battery assembly 100 is performed. For example, the polarization voltage increases in a negative direction when the battery assembly 100 discharges, and the polarization voltage increases in a positive direction when the battery assembly 100 is charged. Then, once charge and discharge of the battery assembly 100 is stopped (finished), the polarization voltage that appears at this time is gradually removed or eliminated (the polarization voltage gradually approaches zero) with a lapse of time.

However, even if the polarization voltage caused by discharge (or charge) is removed with a lapse of time, the battery assembly 100 subjected to the polarization in the negative (or positive) direction due to discharge (or charge) does not completely return to a condition where no polarization arises. For example, the OCV of the battery assembly 100 that has been used while being often discharged in the usage history of charge and discharge of the battery assembly 100 is different from the OCV of the battery assembly 100 that has been used while being often charged, and the correspondence relationship between the SOC and OCV of the battery assembly 100 differs depending on the usage history.

Figure 8:
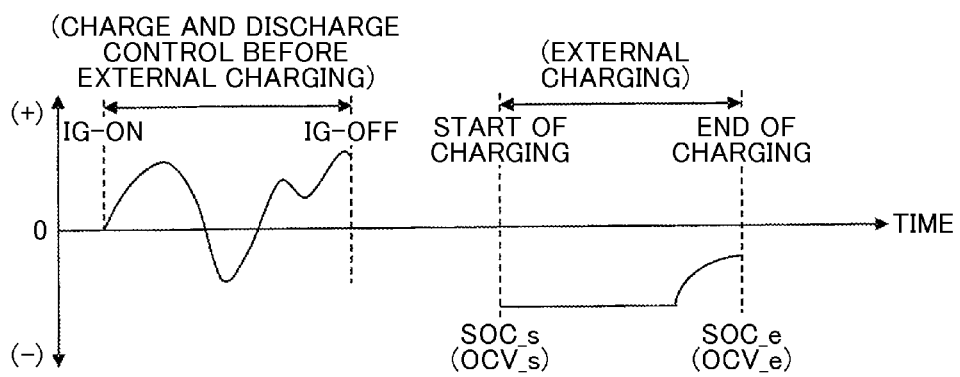
FIG. 8 is a view useful for explaining a method of calculating the full charge capacity during external charging according to the related art.

Therefore, as shown in the example of FIG. 8, the SOC_s calculated from the OCV at the start of charging takes a value depending on the charge-side usage history when the charge and discharge control before the external charging ends on the charge side (i.e., while the battery assembly 100 is being charged), whereas the SOC_s takes a value depending on the discharge-side usage history when the charge and discharge control before the external charging ends on the discharge side (i.e., while the battery assembly 100 is discharging). Since the relationship of the same OCV with the corresponding SOC differs as described above, between the SOC_s based on the charge-side usage history and the SOC_s based on the discharge-side usage history, the SOC of the battery assembly 100 cannot be accurately calculated due to the influence of the usage history of the battery assembly 100.

Accordingly, the SOC_s that is simply calculated from the OCV_s at a point in time of the start of charge is biased toward the charge side or the discharge side, due to the influence of the usage history of the battery assembly 100, in other words, due to an influence of polarization. Thus, the estimation accuracy is reduced as compared with to the SOC of the battery assembly 100 in a condition (where it is not influenced by the usage history) in which the SOC is neither biased toward the charge side nor discharge side due to polarization.

The above explanation also applies to the SOC_e obtained at the end of charging. Since the SCO_e calculated from the OCV_e obtained at the end of charging takes a value depending on the charge-side usage history, the SOC_e is biased toward the charge side due to the influence of polarization, and the estimation accuracy is reduced as compared with the SOC of the battery assembly 100 in a condition where the SOC is not biased toward the charge side due to polarization.

Thus, the SOC that is simply calculated from the OCV in an instantaneous condition of the battery assembly 100 at a specified point in time, i.e., at each of the start of charging and the end of charging, rather than the OCV grasped from conditions of the battery assembly 100 while both of a charging operation and a discharging operation are continuously performed for a given period of time, in other words, the OCV grasped from variations in the current value and voltage value as a whole in a given period, is influenced by the usage history of the battery assembly 100 up to each of the specified points in time (the start of charging and the end of charging). As a result, the estimation accuracy is reduced, and the FCC cannot be accurately calculated as indicated in Eq. 1 above.

Thus, in this embodiment, the SOC used for calculation of the FCC of the battery assembly 100 is grasped from the relationships between a plurality of current values and voltage values detected during charge and discharge continued for a given period of time, so that the influence of the usage history of the battery assembly 100 is curbed or reduced. Consequently, the estimation accuracy of the SOC is improved, and the FCC is calculated with high accuracy.

Figure 5:
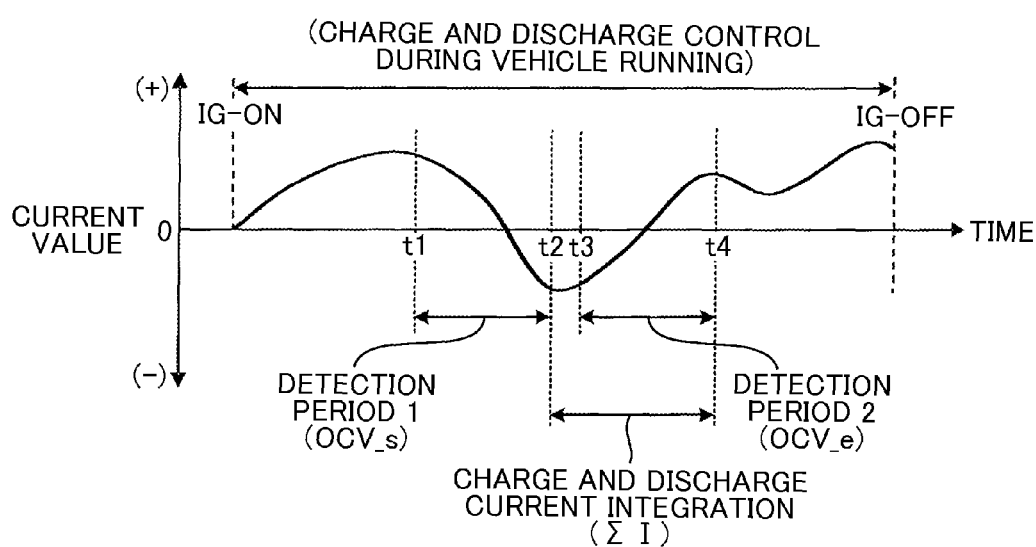
FIG. 5 is a view useful for explaining detection periods in which current values and voltage values are detected so as to specify the OCV of the battery assembly during charge and discharge while the vehicle is traveling.

FIG. 5 is a view showing one example of variations in the current value during charge and discharge while the vehicle is traveling. In this embodiment, relationships between a plurality of current values and voltage values of the battery assembly 100 are detected in each detection period during charge and discharge continued for a given period of time, under charge and discharge control during traveling of the vehicle, so that the OCV of the battery assembly 100 is specified.

As shown in FIG. 5, under charge and discharge control during traveling of the vehicle, the ECU 300 detects the current value of the battery assembly 100, using the current sensor 202, and detects the voltage value of the battery assembly 100, using the monitoring unit 200. When the power storage system is in operation, the current value and the voltage value vary according to charge and discharge of the battery assembly 100. Here, relationships between current values and the voltage values are obtained at a plurality of points in time within a given period, so that I-V points (relationships between the current values and the voltage values) are plotted as shown in FIG. 6.

Figure 6:
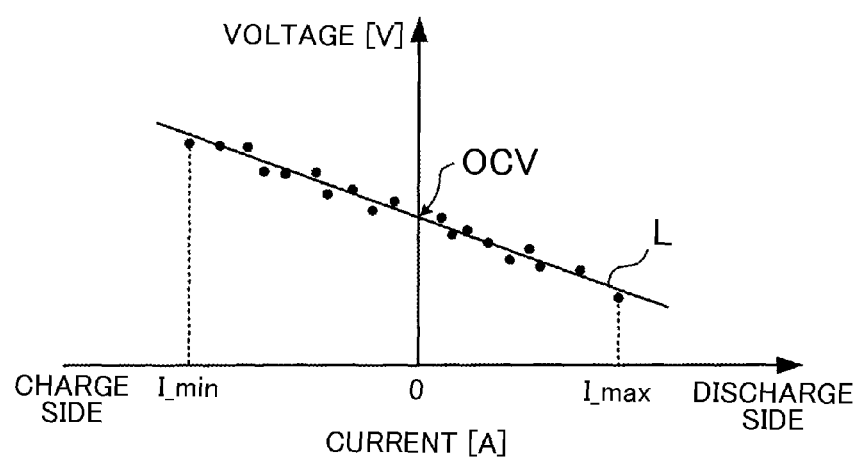
FIG. 6 is a view useful for explaining a method of specifying the OCV of the battery assembly in the power storage system of the embodiment of FIG. 1.

In FIG. 6, the vertical axis indicates voltage, and the horizontal axis indicates current. If a plurality of points indicating relationships between current values and the voltage values are plotted in the coordinate system as shown in FIG. 6, an approximate straight line L can be calculated. In this case, a voltage value at which the approximate straight line L intersects with the vertical axis, in other words, a voltage value at which the current value is equal to 0 [A], provides the OCV of the battery assembly 100. Therefore, the ECU 300 can calculate (estimate) the OCV of the battery assembly 100, based on the detection results of the current sensor 202 and the monitoring unit 200. The approximate straight line L may be obtained by the least-square method, for example.

In this embodiment, each OCV of the battery assembly 100 is calculated, from the relationships between a plurality of current values and voltage values detected in each of two detection zones (detection period 1, detection period 2), which lasts a given length of time. Then, the SOC_s and SOC_e of the battery assembly 100 for use in calculation of the FCC are specified (calculated), based on each OCV thus calculated, using the OCV_SOC map.

Thus, as shown in FIG. 6, the current values are distributed on the charge side and the discharge side, and the OCV calculated from variations in a plurality of current values and voltage values detected in a detection period that lasts a given length of time is less likely or unlikely to be influenced by polarization due to which variations in the current value appear mainly on the charge side or discharge side. Thus, each of the SOCs of the battery assembly 100 corresponding to these OCVs has a reduced influence of the usage history of the battery assembly 100, and can be estimated with improved accuracy.

In the example of FIG. 6, the SOC_s of the battery assembly 100 can be calculated using the SOC-OCV map, from the OCV_s calculated from a plurality of current values and voltage values plotted within the detection period 1 (from time t1 to time t2 shown in FIG. 5) having a given length of time. Further, the SOC_e of the battery assembly 100 can be calculated using the SOC-OCV map, from the OCV_e calculated from a plurality of current values and voltage values plotted within the detection period 2 (from time t3 to time t4 shown in FIG. 5) that starts upon a lapse of a given time from the detection period 1.

Then, the integrated current value is calculated by integrating charge and discharge current of the battery assembly 100, from time t2 (a point in time at which the detection period 1 ends, namely, a point in time at which detection of a plurality of current values and voltage values corresponding to the OCV_s is finished) at which the SOC_s is calculated, to time t4 (a point in time at which the detection period 2 ends, namely, a point in time at which detection of a plurality of current values and voltage values corresponding to the OCV_e is finished) at which the SOC_e is calculated. Then, the FCC as the actually measured value can be calculated according to Eq. 1 as indicated above.

Figure 3:
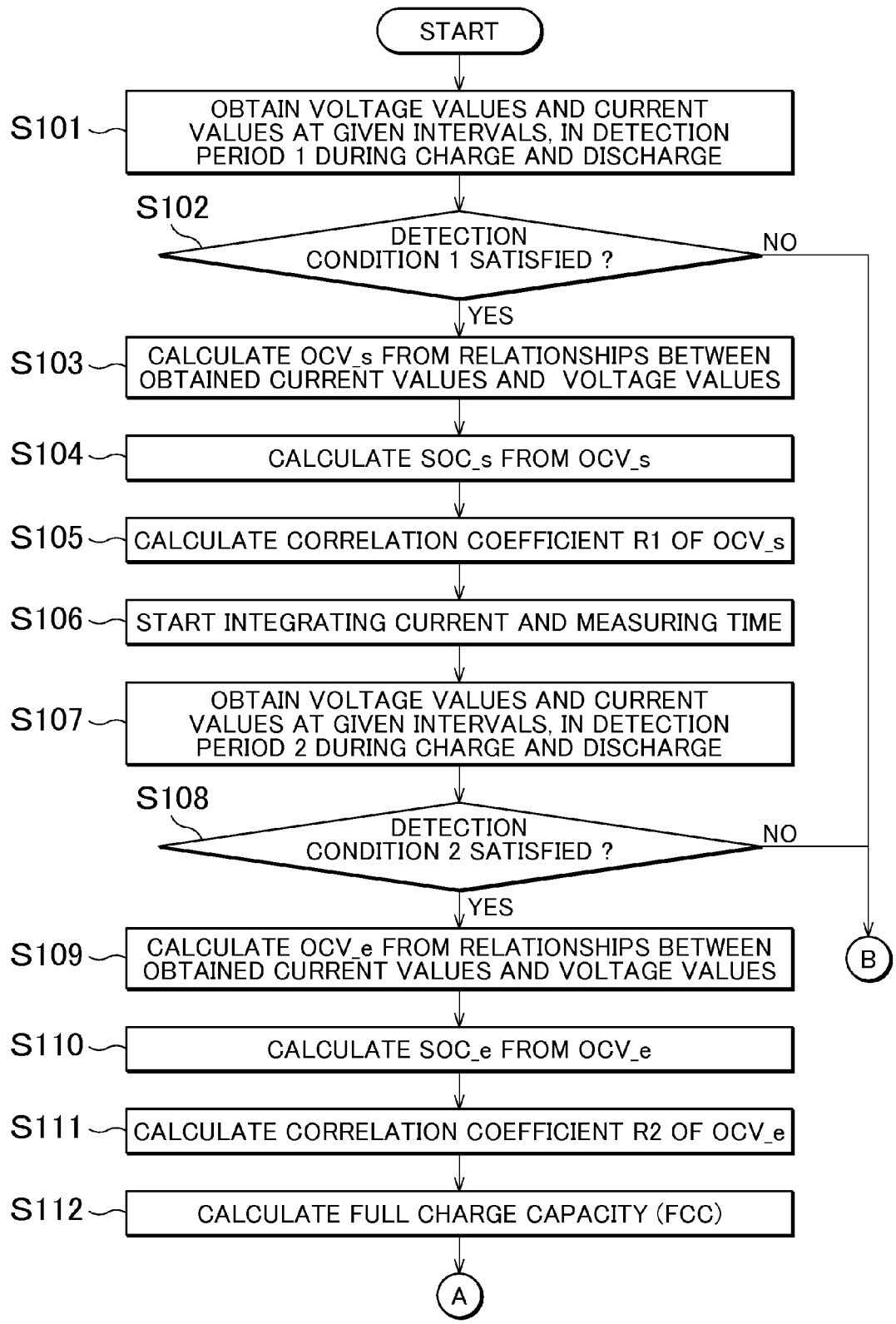
FIG. 3 is a flowchart illustrating a process of calculating the SOC and full charge capacity of a battery assembly in the power storage system of the embodiment of FIG. 1.
Figure 4:
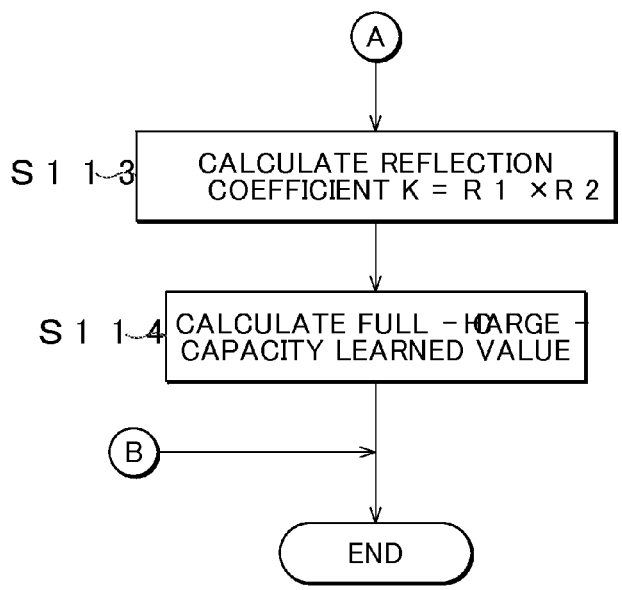
FIG. 4 is a flowchart illustrating a process of calculating a full-charge-capacity learned value of the battery assembly in the power storage system of the embodiment of FIG. 1.

FIG. 3 is a flowchart illustrating a process of calculating the full charge capacity (FCC) according to this embodiment. FIG. 4 is a flowchart illustrating a process of calculating the full-charge-capacity learned value.

In step S101, the ECU 300 detects current values of the battery assembly 100 using the current sensor 202, and detects voltage values of the battery assembly 100 using the monitoring unit 200, at given intervals, within a given period of time, under the charge and discharge control during traveling of the vehicle. When the power storage system is in operation, the ECU 300 obtains current values and voltage values that vary according to charge and discharge of the battery assembly 100, at a plurality of points in time, so as to obtain the relationships between the current values and the voltage values within the detection period 1. The detection period 1 and the detection period 2 may be the same length of time, or may be different lengths of time. Further, each detection time of the detection period 1 and detection period 2 may be set as appropriate, according to the number of current values and voltage values required to be detected for calculating the OCV, and the detection timing.

In step S103, the ECU 300 obtains an approximate straight line L by the least-square method, as in the example shown in FIG. 6, from the current values and voltage values obtained at a plurality of points in time within the detection period 1 during charge and discharge. Then, the ECU 300 calculates a voltage value when the approximate straight line L intersects with the vertical axis (voltage value), namely, a y-intercept of the appropriate straight line L (y=ax+b), as the OCV_s of the battery assembly 100.

Before calculating the OCV_s in step S103, the ECU 300 determines in step S102 whether the OCV_s to be calculated satisfies a certain detection condition or conditions under which an influence of the usage history of the battery assembly 100 is curbed. If it is determined that the influence of the usage history of the battery assembly 100 is curbed, the ECU 300 proceeds to step S103 to calculate the OCV_s. If it is determined that the influence of the usage history of the battery assembly 100 is not curbed, the ECU 300 finishes the process of calculating the FCC and the full-charge-capacity learned value, without calculating the OCV_s.

For example, the detection condition may be whether dispersion of the current values is larger than a predetermined threshold value, in the current values and voltage values obtained at a plurality of points in time within a given period during charge and discharge. The dispersion of the current values may be calculated from respective current values detected within the detection period 1, by a general method for obtaining an arithmetic dispersion, for example. It becomes easier to obtain the approximate straight line L (OCV) as shown in FIG. 6 as the dispersion of the current values is larger, and it becomes more difficult to obtain the approximate straight line L as the dispersion of the current values is smaller.

Also, other than the dispersion of the current values, the amount of change of the current value (the maximum current value I_max, the minimum current value I_min) may be used as a detection condition. For example, even if the dispersion of the current values is large, and the average current value is close to 0, it is difficult to obtain the approximate straight line L if a plurality of plotted points concentrate in a region having a small range of variation in the current value; therefore, the OCV of the battery assembly 100 specified from the approximate straight line L is likely to deviate from the OCV of the actual battery assembly 100. Thus, the detection condition may be that, in the current values detected at plural time points within the detection period during charge and discharge, the maximum current value I_max is larger than a predetermined threshold value, and the minimum current value I_min is smaller than a predetermined threshold value.

In this embodiment, the estimation accuracy of the SOC of the battery assembly 100 is ensured by using dispersion of a plurality of current values within the detection period during charge and discharge, and the maximum current value I_max and the minimum current value I_min, and criteria for determining a given estimation accuracy of the SOC are specified by the current dispersion, and the maximum current value I_max and the minimum current value I_min. The ECU 300 calculates the OCVs when the detection condition 1 (calculation condition) of the OCV_s is satisfied, more specifically, when the current dispersion is larger than a reference value specified so as to assure a given estimation accuracy of the SOC, and the maximum current value I_max and the minimum current value I_min, which defines the amount of change of the current value, are sufficiently large and small, respectively.

While the current dispersion, and the maximum current value I_max and minimum current value I_min that define the amount of change of the current are both used as detection conditions for the OCV_s under which the estimation accuracy of the SOC is ensured, only one of the current dispersion and the amount of change of the current may be used as a detection condition for the OCV_s. Also, the threshold value associated with the current dispersion, and respective threshold values of the maximum current value I_max and the minimum current value I_min may be set as appropriate, in view of the estimation accuracy of the OCV (SOC), and may be stored in advance in the memory 301.

In step S104, the ECU 300 calculates the SOC_s of the battery assembly 100 from the SOC-OCV map, based on the calculated OCV_s. In step S105, the ECU 300 calculates a correlation coefficient R1 used for calculating the reflection coefficient K of the full-charge-capacity learned value, following calculation of the SOC_s of the battery assembly 100.

Figure 7A:
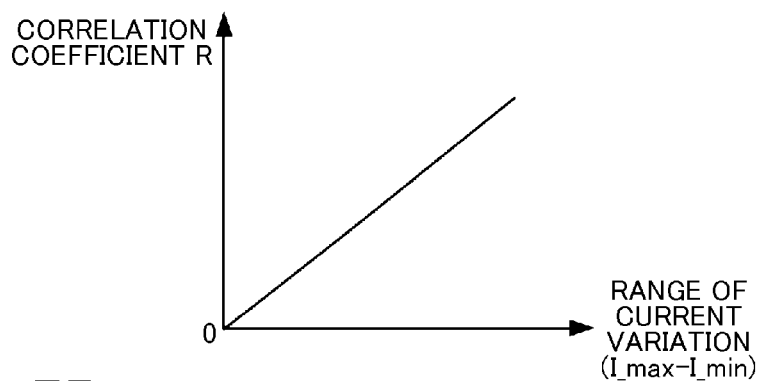
FIG. 7A is a view showing one example of the relationship between a correlation coefficient associated with a reflection coefficient (learning parameter) for calculating a full-charge-capacity learned value of the battery assembly in the power storage system of the embodiment of FIG. 1, and the range of variation of current.
Figure 7B:
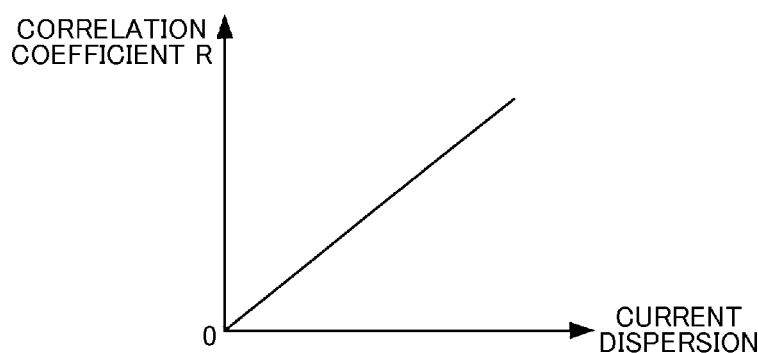
FIG. 7B is a view showing one example of the relationship between a correlation coefficient associated with a reflection coefficient (learning parameter) for calculating a full-charge-capacity learned value of the battery assembly in the power storage system of the embodiment of FIG. 1, and the distribution of current.

The correlation coefficient R is used for evaluating the estimation accuracy of the OCV_s, and is determined based on the current dispersion and the range of variation in the current (a difference between the maximum current value I_max and the minimum current value I_min). FIG. 7A shows one example of the correlation coefficient R that varies with the range of current variation. As shown in FIG. 7A, the correlation coefficient R takes a larger value as a difference between the maximum current value I_max and the minimum current value I_min as the range of current variation is larger. FIG. 7B shows one example of the relationship between the current dispersion and the correlation coefficient R. As shown in FIG. 7B, the correlation coefficient R takes a larger value as the current dispersion is larger. Thus, the larger correlation coefficient R represents the higher estimation accuracy of the OCV_s.

For example, the correlation coefficient R1 corresponding to the SOC_s may be obtained by calculating the correlation coefficient R regarding the current dispersion from FIG. 7A, and the correlation coefficient R regarding the range of current variation from FIG. 7B, respectively, and multiplying the calculated correlation coefficients R. Each of the correlation coefficients R shown in FIG. 7A and FIG. 7B takes a value between 0 and 1, and the correlation coefficient R1 also takes a value between 0 and 1

In step S106, the ECU 300 performs a time measuring operation to measure a length of time from the time when the SOC_s is calculated (a point in time at which detection of a plurality of current values and voltage values corresponding to the OCV_s is finished), using the timer 302, and starts an operation to integrate charge and discharge current.

Then, in step S107, the ECU 300 detects current values and voltage values at a plurality of points in time within the next detection period 2 during charge and discharge, for calculating the SOC_e. Then, in step S108, the ECU 300 determines whether a detection condition (or a set of detection conditions) 2 under which the OCV_e is detected, assuring certain estimation accuracy, is satisfied, as in step S102. If the detection condition 2 is satisfied, the ECU 300 proceeds to step S109, and calculates the OCV_e. If the detection condition 2 is not satisfied, the ECU 300 finishes the process of calculating the FCC and the full-charge-capacity learned value, without calculating the OCV_e.

The detection condition 2 used in step S108 includes a determination as to whether an elapsed time from the time when the SOC_s was calculated is within a predetermined time, in addition to the detection condition 1 of step S102. Namely, if current values and voltage values of the battery assembly 100 are detected in the detection period 2 that is excessively spaced from the time when the SOC_s was calculated, the SOC_s and the SOC_e largely deviate from each other, and the full charge capacity may not be accurately calculated. Therefore, in this embodiment, a condition that the elapsed time from the time when the SOC_s was calculated is within the predetermined time is included as a condition for calculation of the SOC_e.

In step S110, the ECU 300 calculates the SOC_e of the battery assembly 100 from the SOC-OCV map, based on the calculated OCV_e. In step S111, the ECU 300 calculates a correlation coefficient 2 used for calculating the reflection coefficient K of the full-charge-capacity learned value, following calculation of the SOC_s of the battery assembly 100. Like the correlation coefficient R1, the correlation coefficient R2 can be obtained from the relationships as shown in FIG. 7A and FIG. 7B.

The ECU 300 calculates the FCC after the SOC_s and SOC_e of the battery assembly 100 are calculated in step S101 to step S111. The FCC can be calculated according to Eq. 1 as indicated above, in which a value obtained by integrating charge and discharge current values from the time when the SOC_s is calculated to the time when the SOC_e is calculated is used as the integrated current value. The calculated FCC may be stored in the memory 301.

The ECU 300 calculates the full-charge-capacity learned value, using the calculated FCC. The process of calculating the full-charge-capacity learned value may be carried out along with calculation of the FCC, or independently of calculation of the FCC. The full-charge-capacity learned value is calculated according to Eq. 2 as indicated above, and the reflection coefficient K used for calculation of the full-charge-capacity learned value can be determined based on the correlation coefficients R1, R2 resulting from evaluation of the estimation accuracy with which the SOC_s and SOC_e of the battery assembly 100 are estimated.

The reflection coefficient K of this embodiment may take a value between 0 and 1, and is specified so as to be a larger value as the correlation coefficient R is larger. Namely, the reflection coefficient K of this embodiment takes a larger value as the current dispersion is larger, in the detection period 1 and detection period 2 corresponding to the SOC_s and SOC_e, respectively, used for calculation of the FCC, and the reflection coefficient K takes a larger value as the range of current variation (a difference obtained by subtracting the minimum current value I_min from the maximum current value I_max) is larger. Thus, the value of the reflection coefficient K is specified so as to be larger as the estimation accuracy with which the SOC_s, SOC_e (OCV_s, OCV_e) are estimated is higher, and the degree of reflection of the FCC by the full-charge-capacity learned value is increased, so that the calculation accuracy of the full-charge-capacity learned value is improved.

In this embodiment, the reflection coefficient K may be obtained by calculating the product of the correlation coefficients R1, R2 corresponding to the SOC_s, SOC_e, respectively, (reflection coefficient K=correlation coefficient R1×correlation coefficient R2), for example. In step S113 (shown in FIG. 4), the ECU 300 calculates the reflection coefficient K, using the correlation coefficients R1, R2.

In step S114 (shown in FIG. 4), the ECU 300 calculates the latest full-charge-capacity learned value according to Eq. 2, using the reflection coefficient K calculated in step S113, FCC, and the last full-charge-capacity learned value. When the last full-charge-capacity learned value is not stored in the memory 301, namely, when the full-charge-capacity learned value is calculated for the first time, the calculated FCC is used as it is as the full-charge-capacity learned value of this cycle. The full-charge-capacity learned value thus calculated is stored in the memory 301.

According to this embodiment, the open-circuit voltage is calculated from the relationships between a plurality of current values and voltage values detected in a given period during charge and discharge of the battery assembly 100, so that the SOC of battery assembly 100 having a reduced influence of the usage history of the battery assembly 100 is specified, for use in calculation of the full charge capacity. Therefore, the SOC used for calculating the full charge capacity (FCC) can be calculated with high accuracy, and the accuracy with which the full charge capacity of the battery assembly 100 is calculated (including the accuracy with which the full-charge-capacity learned value is calculated) can be improved.

Also, according to this embodiment, the full charge capacity is calculated, using the SOC of the battery assembly 100 under charge and discharge control during traveling of the vehicle; therefore, the frequency of calculation of the full charge capacity, and the frequency of calculation of the fullcharge-capacity learned value, are higher, as compared with the case where the full charge capacity is calculated during external charging. Accordingly, the full-charge-capacity learned value for the current battery assembly 100 can be easily grasped.

It is known that the battery assembly 100 (cell 10) deteriorates as time passes. As the deterioration of the battery assembly 100 (cell 10) proceeds, the full charge capacity of the battery assembly 100 is also reduced. For example, where each of the cells 10 is a lithium-ion secondary battery, the full charge capacity of the battery assembly 100 is reduced, in a deteriorated condition in which lithium is deposited. In this embodiment, however, the full charge capacity and the full-charge-capacity learned value are calculated at high frequencies; therefore, the deterioration, or the like, can be grasped early, and the charge and discharge control of the battery assembly 100 can be performed while reducing deviation of the SOC due to reduction of the full charge capacity.

In the illustrated embodiment, the SOC of the battery assembly 100 under the charge and discharge control during traveling of the vehicle is specified, for use in calculation of the FCC and the full-charge-capacity learned value. However, this invention may be applied to calculation of the FCC and the full-charge-capacity learned value during external charging, for example.

As described above, in the example of the related art shown in FIG. 8, a plurality of varying current values and voltage values within a detection period that lasts a given length of time during external charging may be plotted for calculation of the OCV, and the SOC may be grasped from variations in the current values and voltage values as a whole. Therefore, the SOC of the battery assembly 100 can be calculated with higher accuracy, than the SOC calculated from the OCVs at instantaneous points in time before and after charging, and the accuracy with which the full charge capacity of the battery assembly 100 is calculated can be improved.

This invention may be similarly applied to the case where the OCV is calculated from a plurality of varying current values and voltage values within a detection period that lasts a given length of time during discharging. For example, the method of calculating the FCC and the full-charge-capacity learned value may be applied when the vehicle is at rest (stopped) with the power storage system being in operation (ready-on).

Thus, the method of calculating the full charge capacity according to this embodiment may be applied to calculation of the full charge capacity by calculating the OCV from the relationships between current values and voltage values in a given period during charge or discharge or a given period during charge and discharge, and specifying the SOC of the battery assembly 100.

What is claimed is:

1. A power storage system installed on a vehicle, comprising:
a power storage device configured to be charged and discharged;
a controller configured to calculate an open-circuit voltage of the power storage device from relationships between a plurality of current values and a plurality of voltage values detected in a predetermined period during charge and discharge of the power storage device,
the controller being configured to specify an SOC corresponding to the calculated open-circuit voltage, from a correspondence relationship between the SOC and the open-circuit voltage of the power storage device,
the controller being configured to calculate a full charge capacity of the power storage device, based on the SOC and an integrated value, the SOC being specified with respect to each of a first period and a second period during charge and discharge, and the integrated value being an integrated value of charge and discharge current of the power storage device from the first period to the second period, wherein
the controller is configured to calculate the full charge capacity, when dispersion, a maximum current value, and a minimum current value of said plurality of current values detected in the first period or the second period satisfy respective conditions, in the respective conditions each of respective reference values being determined according to a given estimation accuracy of the SOC.

2. The power storage system according to claim 1, wherein the controller is configured to calculate a full-charge-capacity learned value by learning each time the full charge capacity is calculated.

3. The power storage system according to claim 1, wherein the controller is configured to calculate the open-circuit voltage by detecting relationships between a plurality of current values and a plurality of voltage values in the predetermined period for calculating the full charge capacity, during a charging or discharging operation of the power storage device while the vehicle is traveling.

4. A power storage system installed on a vehicle, comprising:
a power storage device configured to be charged and discharged;
a controller configured to calculate an open-circuit voltage of the power storage device from relationships between a plurality of current values and a plurality of voltage values detected in a predetermined period during charge and discharge of the power storage device,
the controller being configured to specify an SOC corresponding to the calculated open-circuit voltage, from a correspondence relationship between the SOC and the open-circuit voltage of the power storage device,
the controller being configured to calculate a full charge capacity of the power storage device, based on the SOC and an integrated value, the SOC being specified with respect to each of a first period and a second period during charge and discharge, and the integrated value being an integrated value of charge and discharge current of the power storage device from the first period to the second period, wherein
the controller is configured to calculate the integrated value, based on the charge and discharge current of the power storage device from an end of the first period to an end of the second period.

5. A power storage system installed on a vehicle, comprising:
a power storage device configured to be charged and discharged;
a controller configured to calculate an open-circuit voltage of the power storage device from relationships between a plurality of current values and a plurality of voltage values detected in a predetermined period during charge and discharge of the power storage device,
the controller being configured to specify an SOC corresponding to the calculated open-circuit voltage, from a correspondence relationship between the SOC and the open-circuit voltage of the power storage device,
the controller being configured to calculate a full charge capacity of the power storage device, based on the SOC and an integrated value, the SOC being specified with respect to each of a first period and a second period during charge and disc and the integrated value being an integrated value of charge and discharge current of the power storage device from the first period to the second period, wherein the controller is configured to calculate the full charge capacity when an elapsed time between the first period and the second period is within a predetermined period of time.

6. A power storage system installed on a vehicle, comprising:

a power storage device configured to be charged and discharged;

a controller configured to calculate an open-circuit voltage of the power storage device from relationships between a plurality of current values and a plurality of voltage values detected in a predetermined period during charge and discharge of the power storage device, the controller being configured to specify an SOC corresponding to the calculated open-circuit voltage, from a correspondence relationship between the SOC and the open-circuit voltage of the power storage device, the controller being configured to calculate a full charge capacity of the power storage device, based on the SOC and an integrated value, the SOC being specified with respect to each of a first period and a second period during charge and discharge, and the integrated value being an integrated value of charge and discharge current of the power storage device from the first period to the second period, wherein the controller is configured to calculate a full-charge-capacity learned value by learning each time the full charge capacity is calculated, wherein the controller is configured to calculate a new full-charge-capacity learned value by reflecting the calculated full charge capacity by the full-charge-capacity learned value calculated last time, and is configured to change an amount of reflection of the calculated full-charge capacity reflected by the new full-charge-capacity learned value, based on dispersion of said plurality of current values and a range of variation of the current values, the dispersion of the plurality of current values being detected in the first period and the second period, and the range of variation of the current values being based on a maximum current value and a minimum current value.

7. A method of calculating a full charge capacity of a power storage device installed on a vehicle, comprising:

detecting relationships between a plurality of current values and a plurality of voltage values, in each of a first period and a second period during charge and discharge of the power storage device;

calculating an open-circuit voltage of the power storage device in each of the first period and the second period, from the relationships between the current values and the voltage values;

specifying an SOC corresponding to the calculated open-circuit voltage, from a correspondence relationship between the SOC and the open-circuit voltage of the power storage device; and calculating the full charge capacity, based on the SOC and an integrated value, the SOC being specified with respect to each of the first period and the second period, and the integrated value being an integrated value of charge and discharge current of the power storage device from the first period to the second period, wherein when dispersion, a maximum current value, and a minimum current value of said plurality of current values detected in the first period or the second period satisfy respective conditions, in the respective conditions each of respective reference values being determined according to a given estimation accuracy of the SOC.

* * * * *